United States Patent [19]

Brown

[11] Patent Number: 4,536,782

[45] Date of Patent: Aug. 20, 1985

[54] FIELD EFFECT SEMICONDUCTOR DEVICES AND METHOD OF MAKING SAME

[75] Inventor: Dale M. Brown, Schenectady, N.Y.

[73] Assignee: General Electric Company, Schenectady, N.Y.

[21] Appl. No.: 534,898

[22] Filed: Sep. 22, 1983

[51] Int. Cl.³ ............................................ H01L 29/78
[52] U.S. Cl. .................... 357/23.1; 357/23.3; 357/23.11; 357/90; 357/49; 357/23.9; 357/55; 357/50; 357/56
[58] Field of Search .................... 357/23.3, 23.11, 23.1, 357/90, 49, 23.9, 55, 50, 56

[56] References Cited

U.S. PATENT DOCUMENTS

| | | | |
|---|---|---|---|
| 3,832,248 | 8/1974 | Bazin et al. | 357/23.11 |
| 4,108,686 | 8/1978 | Jacobus, Jr. | 357/23.9 |
| 4,186,408 | 1/1980 | Esch et al. | 357/23.3 |
| 4,212,100 | 7/1980 | Paivinen et al. | 357/59 |
| 4,243,997 | 1/1981 | Natori et al. | 357/56 |
| 4,282,647 | 8/1981 | Richman | 357/23.11 |
| 4,324,038 | 4/1982 | Chang et al. | 357/23.9 |

Primary Examiner—Martin H. Edlow
Assistant Examiner—Lamarr A. Brown
Attorney, Agent, or Firm—Julius J. Zaskalicky; James C. Davis, Jr.; Marvin Snyder

[57] ABSTRACT

A transistor is formed about a recess in the planar surface of a substrate of silicon. A pair of insulating spacers is provided in the recess, each abutting a respective side of the recess. Gate oxide is formed in the recess between the insulating spacers. A gate electrode is provided having one base overlying the gate oxide and the other base substantially coplanar with the planar surface. A source region extends from one side of the channel underlying the gate oxide to the planar surface. A drain region extends from the other side of the channel underlying the gate oxide to the planar surface.

8 Claims, 13 Drawing Figures

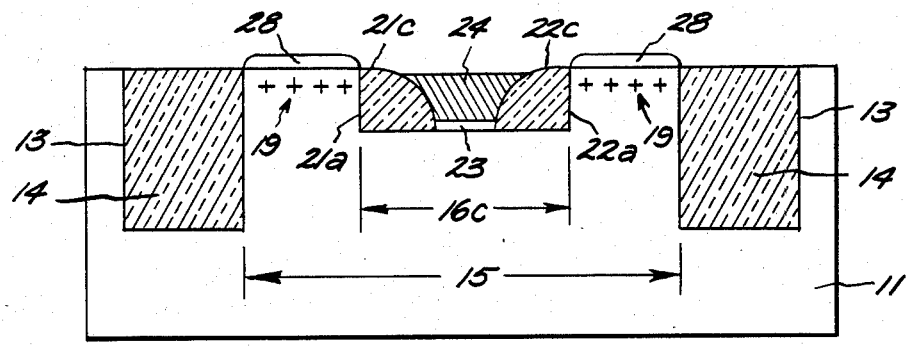
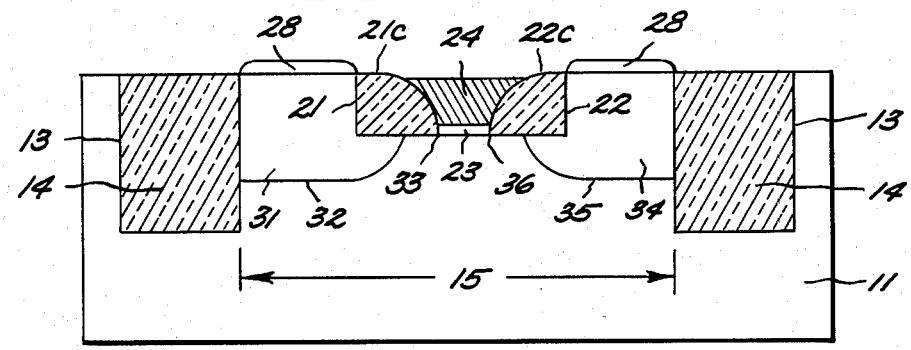
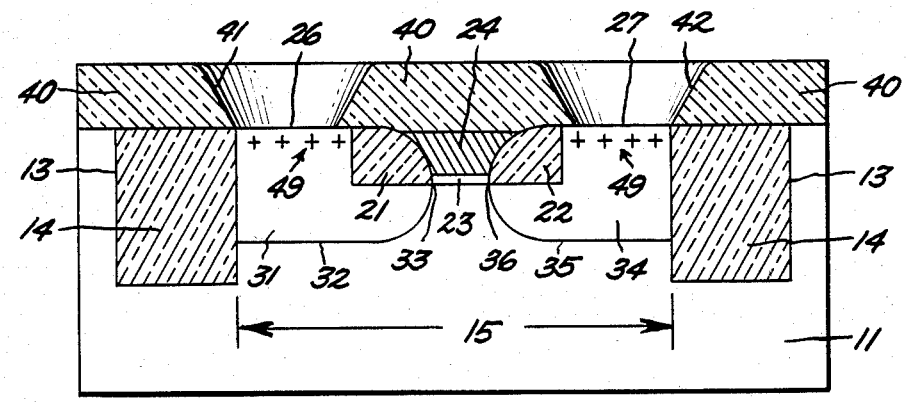

FIELD EFFECT SEMICONDUCTOR DEVICES AND METHOD OF MAKING SAME

The present invention relates, in general, to field effect semiconductor devices and in particular to field effect transistors which are of small dimensions yet which have high performance characteristics and are relatively easy to fabricate.

An object of the present invention is to provide a field effect transistor of short channel length which can be fabricated by masks of substantially larger feature lengths.

Another object of the present invention is to provide a field effect transistor of small dimensions which can be fabricated utilizing a minimum number of masks of substantially larger feature dimensions.

Another object of the present invention is to provide a field effect transistor in which the electrodes thereof have surfaces which are substantially coplanar.

Another object of the present invention is to provide a field effect transistor of small dimensions which can withstand high drain to source voltages without breakdown.

Another object of the present invention is to provide a field effect transistor of short channel length in which the gate threshold voltage is readily controllable.

Another object of the present invention is to provide a field effect transistor of small dimensions in which short channel effects are minimized.

Another object of the present invention is to provide a field effect transistor of small gate length which is not dependent in the fabrication thereof upon masks having features of the same small size as the gate length.

Another object of the present invention is to provide a field effect transistor of small dimensions in which high gate electrode conductivity is provided.

Another object of the present invention is to provide a field effect transistor of small dimensions which has high sheet conductivity in the source and drain regions thereof.

Another object of the present invention is to provide a field effect transistor of small dimensions in which the source and drain regions extend deep into the substrate thereby enabling the conductive connections to be made thereto without shorting of the PN junction by contacts made to these regions.

Another object of the present invention is to provide field effect transistors of small dimensions in which the gate-to-drain capacitance is controllable by a pair of process parameters.

Another object of the present invention is to provide a field effect transistor of small dimensions in which the source to drain conduction is minimally modulated by drain voltage variations.

A further object of the present invention is to provide a relatively simple method of making field effect transistors of small dimensions.

In carrying out the invention in one illustrative embodiment thereof, there is provided a substrate of semiconductor material of one conductivity type having a planar surface. The substrate has a recess in the planar surface extending into the substrate. The recess has a pair of parallel sides orthogonal to the planar surface and a base therebetween.

A first insulating spacer is provided including a first side, a second side, a bottom base and a top base. The first side of the first spacer has a height equal to the height of the first side of the recess and is contiguous therewith. The bottom base has a length less than one-half of the length of the base of the recess and contiguous therewith. The top base is substantially coplanar with the planar surface of the substrate.

A second insulating spacer is provided including a first side, a second side, a bottom base and a top base. The first side of the second spacer has height equal to the height of the second side of the recess and contiguous therewith. The bottom base of the second space has a length less than one-half of the base of the recess and contiguous therewith. The top base is substantially coplanar with the planar surface.

A thin insulating member is provided having a bottom surface contiguous with the base of the recess between the first and second insulating spacers, a pair of sides, each contiguous with a respective one of the second sides of the first and second insulating spacers.

A conductive member is provided having a bottom base contiguous with the top surface of the thin insulating member, a top base extending between the second side of the first and second insulating spacers, a first side contiguous with the second side of the first insulating spacer and a second side contiguous with the second side of the second insulating spacer.

A first region of opposite conductivity type is provided in the substrate adjacent the major surface thereof and the first insulating spacer and forming a first PN junction with the substrate. The first PN junction has an edge in the base of the recess and adjacent the bottom surface of the thin insulating member and the bottom base of the first insulating spacer.

A second region of opposite conductivity type is provided in said substrate adjacent the major surface thereof and the second insulating spacer and forming a second PN junction with the substrate. The second PN junction has an edge in the base of the recess and adjacent the bottom surface of the thin insulating member and the bottom base of the second insulating spacer.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIGS. 4A–4I are schematic illustrations of vertical cross sections of a piece of a semiconductor wafer in the process of fabrication of a yield effect transistor in accordance with the present invention.

Figure 1:
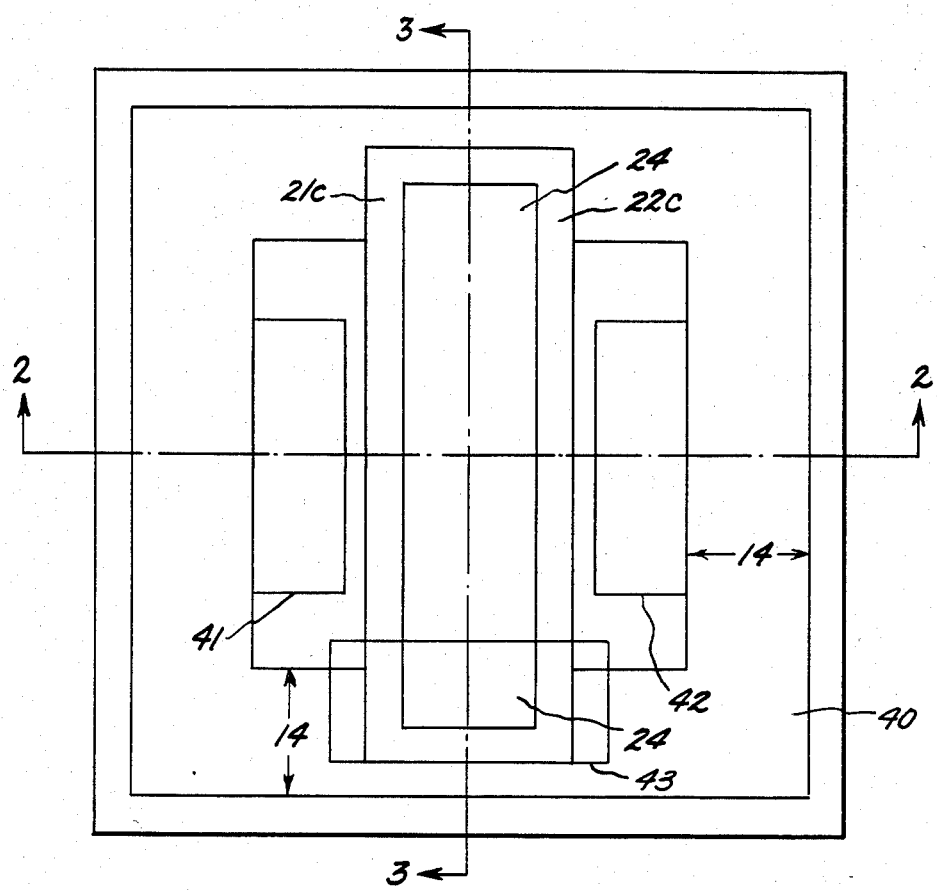
FIG. 1 is a plan view of a field effect transistor in accordance with the present invention.
Figure 2:
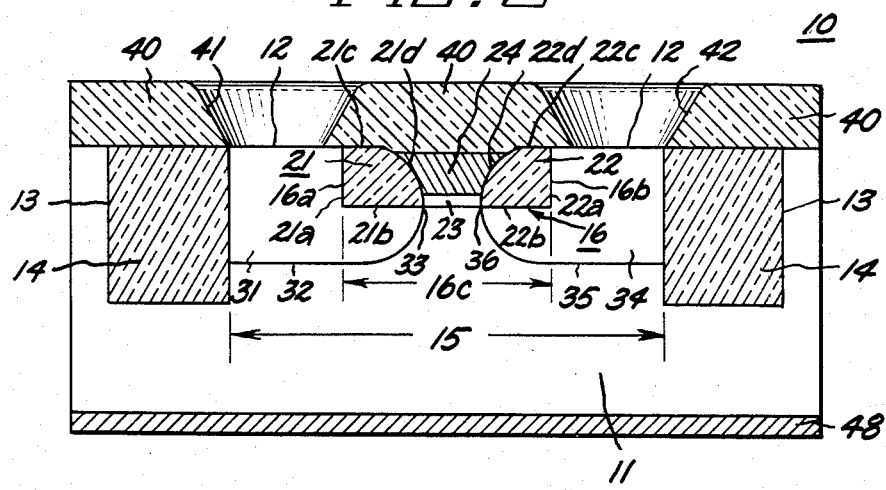
FIG. 2 is a sectional view of the device of FIG. 1 taken along section lines 2—2 showing the internal construction thereof.
Figure 3:
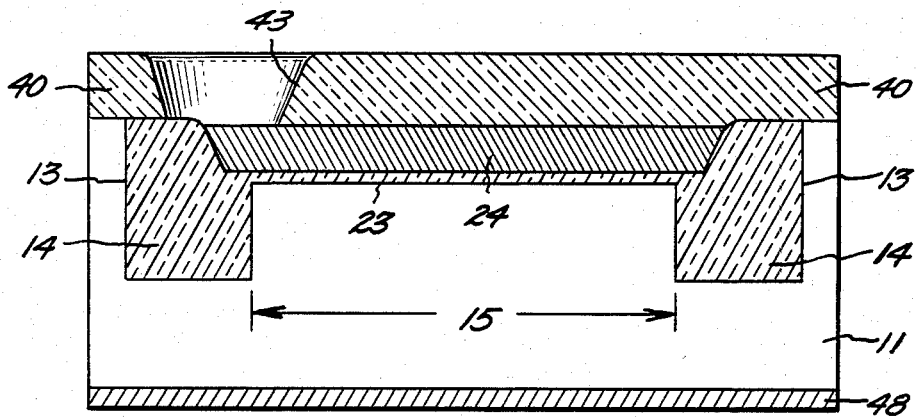
FIG. 3 is another sectional view of a portion of the device of FIG. 1 taken along section lines 3—3 thereof also showing the internal construction thereof.

Referring now to FIGS. 1, 2 and 3 there is shown a portion of an integrated circuit including a field effect transistor 10 made in accordance with the present invention. The device includes a substrate 11 of monocrystalline silicon semiconductor material of N-type conductivity and relatively high resistivity, for example, 2 ohms-cm provided by a net donor activator concentration of a first value. Substrate 11 may conveniently be 10 mils thick. A trench 13 about a micron wide and about a micron deep is formed in the planar surface 12 of the substrate 11 and filled with an insulating material 14 such as silicon dioxide surrounding an active region 15 of the substrate isolating this region from other such regions formed in the integrated circuit substrate. The sides of the active region 15 form a square in the plane of the major surface 12 of the substrate. A recess 16 is provided in the substrate extending from the major surface 12 into the substrate. The recess 16 has a pair of parallel sides 16a and 16b orthogonal to the major surface 12 and a base 16c between the sides. The length of the base is conveniently made 1.5 microns and the height of the sides 16a and 16b are each 0.5 of a micron. The recess is formed by photolithographic masking and etching techniques well known in the art.

A first insulating space 21 having a first side 21a, a bottom base 21b, a top base 21c and a second side 21b is provided. The first side 21a of the first spacer 21 has a height equal to the height of the first side 16a of the recess 16 and contiguous therewith. The bottom base 21b has a length less than one-half of the length of the base 16c of the recess 16 and contiguous therewith. The top base 21c has a length less than the length of the bottom base 21b and is substantially coplanar with a major surface 12 of the substrate. A second insulating spacer 22 having a first side 22a, a bottom base 22b, a top base 22c and a second side 22d is provided. The first side 22a of the second spacer has a height equal to the height of the second side 16b of the recess 16 and is contiguous therewith. The bottom base 22b of the second spacer 22 has a length less than one-half of the length of the base 16c of the recess 16 and contiguous therewith. The top base 22c of the second spacer has a length less than the bottom base 22b thereof and is substantially coplanar with the major surface 12. A thin insulating member 23 is provided having a bottom surface contiguous with the base 16c of the recess 16 between the first and second insulating spacers 21 and 22. Insulating member 23 has a pair of sides each contiguous with a respective one of the second sides of the first insulating spacer 21 and the second insulating spacer 22. A conductive member 24 constituting a gate electrode is provided having a bottom base contiguous with the top surface of the insulating member 23, a top base extending between the second side 21d of the first insulating spacer and the second side 22d of the second insulating spacer. A first side of the conductive member 24 is contiguous with the second side of the first insulating spacer 21. A second side of the conducting member 24 is contiguous with the second side of the second insulating spacer 22.

The insulating spacers 21 and 22 may be formed by covering the major surface of the substrate 11 and the recess 16 with silicon dioxide, for example by chemical vapor deposition, to a depth of about 0.5 micron and thereafter anisotropically etching the layer of silicon dioxide until the portions of the layer overlying the major surface 12 are completely removed thereby leaving the spacer portions 21 and 22 in the recess 16 as shown in FIG. 2. The thin layer 23 of silicon dioxide may be formed by thermally growing silicon dioxide in the exposed portion of the base 16c of the recess to the desired thickness. The gate electrode and conductor 24 may be formed by sputtering a layer of a metal, such as molybdenum, over a surface of the silicon substrate 11 over the spacers 21 and 22 and over the thin oxide layer 23 to a depth of about one-half micron, flowing over the layer of molybdenum a suitable photoresist material, such as Hunt photoresist type 704, made by the Philip A. Hunt Chemical Company of Palisades, N.J. to form a planar surface over the layer of molybdenum. The photoresist etches at the same rate as molybdenum when an etch gas consisting of a mixture of 33% of oxygen and 33% of carbon tetrachloride by volume is utilized. The resultant structure is planarized by etching away the photoresist and the molybdenum until the molybdenum is completely removed from the surface 12 of the substrate 11 leaving the remainder portion as conductor 24. Preferably, the etch process is carried beyond this point to remove a small amount of the remaining portion of the molybdenum to assure that base 21c and base 22c of insulating members 21 and 22 are exposed isolating the conductive member 24 from the major surface 12.

A first region 31 of P-type conductivity is formed in the substrate adjacent the major surface 12 and the first insulating spacer 21 providing a first PN junction 32 with a substrate. The first PN junction 32 has an edge 33 in the base 16c of the recess and adjacent the bottom surface of the thin insulating member 23 and the bottom base 21b of the first insulating spacer 21. The net impurity or acceptor activator concentration in the first region 31 of P-type conductivity type increases from zero at the first PN junction 32 to a second value at the major surface 12 thereof. The net impurity or donor activator concentration in the substrate of N-type conductivity type increases from zero at the first PN junction 32 to a value substantially equal to the aforementioned first value of net donor activator concentration in the substrate at a distance along the base 16c of the recess away from the first region 31. The second value of net acceptor activator concentration being substantially greater than the first value of net donor activator concentration. The second region 34 of opposite conductivity type is formed in the substrate adjacent the major surface 12 and the second insulating spacer 22 providing a second PN junction 35 with the substrate. The second PN junction 35 has an edge 36 in the base 16c of the recess and adjacent the bottom surface 22b of the thin insulating member 22 and the bottom base 22b of the second insulating spacer 22. The net impurity or acceptor activator concentration in the second region 34 of P-type conductivity type increases from zero at the second PN junction 35 to a second value at the major surface 12. The net impurity or donor activator concentration in the substrate of N-type conductivity type increases from zero at the second PN junction 35 to substantially the aforementioned first value at a distance along the base 16c of the recess away from the second region 34.

The region 31 and the region 34 of P-type conductivity type are formed by initially depositing by ion implantation a predetermined quantity of acceptor activators, such as boron, of a concentration of about $10^{13}$ ions per $cm^2$, upon the major surface 12 of the surface of the substrate and thereafter activating the boron ions by heating at a temperature and for a time to cause the ions to diffuse into the substrate downward along the sides of the recess 16 and along the bottom portion 16c of the recess to form junctions therein which are short of the junctions 32 and 35 by a predetermined distance as measured along the base 16c of the recess. Thereafter, depositing a much larger dose of boron ions, for example, boron in a concentration of $5 \times 10^{15}$ ions per $cm^2$ on the major surface 12 and thereafter activating and diffusing these impurities at a temperature and for a time into the substrate to cause the junction 32 and the junction 35 to form in the locations illustrated in FIG. 2, substantially underlying the sides of thin insulating member 23. These processes produce the first region 31 of P-type conductivity in which the impurity concentration is substantially linearly graded from a heavy concentration adjacent the major surface 12 to a zero concentration at the junction, and also a second region 34 of P-type conductivity similarly graded. The linear grading also extends into the channel region of the substrate underlying the gate oxide layer 23. Only the drain PN junction needs to be substantially linearly gated. Accordingly, the source PN junction could be formed in other ways, if desired.

A thick layer 40 of silicon dioxide is chemically vapor deposited on the major surface of the substrate 11. Thereafter, the thick layer 40 of silicon dioxide is patterned to form openings 41, 42 and 43 therein exposing the source region 31, the drain region 34 and the gate electrode 24. Thereafter, a layer of aluminum is sputtered over the surface of the resultant structure and into the openings 41, 42 and 43. The layer of aluminum is then patterned to remove portions thereof leaving the conductive connections (not shown) making contact with the source region 31, the drain region 34 and the gate electrode 24, respectively. The device is then heated to a temperature of about 550° C. for a time to bond the conductive connections of aluminum to the source region 31, the drain region 34 and the gate electrode 24. Subsequently, a conductive connection 48 of aluminum is formed on the opposite surface of the substrate.

Reference is now made to FIGS. 4A–4I which illustrate the manner of fabrication of field effect transistors of FIGS. 1–3 in accordance with the present invention. Elements in FIGS. 4A–4I identical to elements of FIGS. 1–3 are identically designated. Initially, a wafer 11 of monocrystalline silicon semiconductor material of relatively high resistivity, for example 2 ohm cm, having a convenient thickness, for example 10 mils, and N-type conductivity is obtained. The wafer may be of any convenient diameter on which a very large number of individual field effect transistors such as shown in FIGS. 1–3 may be formed. Diagrams of FIGS. 4A–4I show the processing of the wafer as it affects the individual transistor on the wafer. After suitable cleaning of the surface of the wafer a trench 13 about one micron wide and about one micron deep is etched into the silicon substrate utilizing photolithographic masking and etching techniques well known in the art to form an active region 15 of square outline of 3.5 microns on a side surrounded by the recess. Thereafter, the wafer is exposed to a mixture of silane and oxygen at a temperature of about 900° C. for a sufficient period of time to fill the trenches 13 with silicon dioxide and also cover the exposed surfaces 12 of the wafer of silicon. The wafer is next planarized. To this end, the wafer is covered with a suitable photoresist such as Hunt type 704 photoresist mentioned above. Thereafter, the resist and the silicon dioxide are reactive ion etched in an atmosphere of carbon tetrachloride to produce the structure shown in FIG. 4A in which an active region 15 isolated from other active regions by the isolation regions 14 of silicon dioxide formed in the substrate.

Figure 4A:
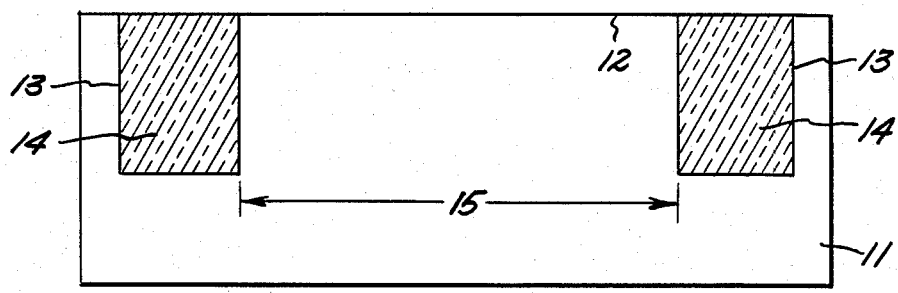
Figure 4B:
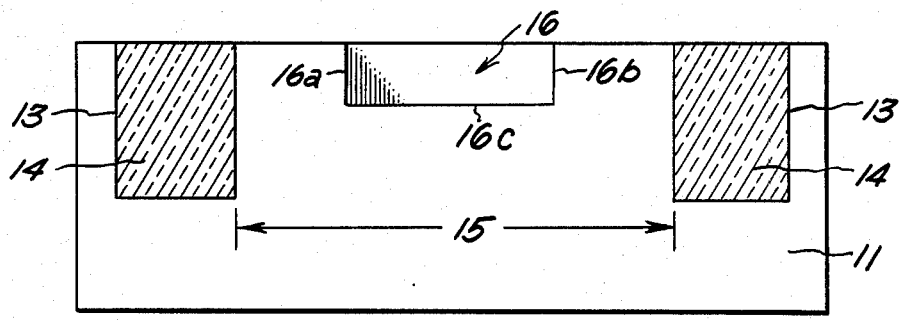

In the next step of the process illustrated in FIG. 4B, a recess 16 is reactive ion etched into the planar surface 12 of the silicon substrate and also into the isolation regions 14 as shown in FIGS. 2 and 3. Carbon tetrachloride ($CCl_4$) is used as the etch gas for etching silicon and trifluoromethane ($CHF_3$) is used as the etch gas for etching silicon dioxide. The recess 16 has side portions 16a and 16b orthogonal to the planar surface, and a base or bottom portion 16c parallel to the planar surface 12. Side 16a is spaced about 1 micron from trench 13. Side 16b is also spaced about 1 micron from trench 13. Bottom portion 16c is spaced about one-half micron from the planar surface 12.

Figure 4C:
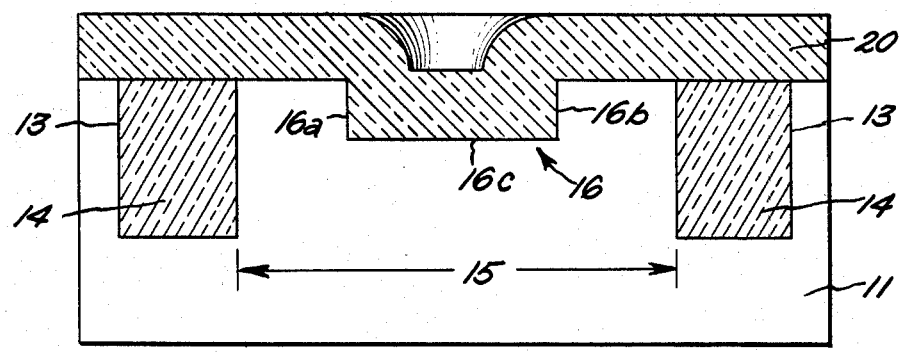
Figure 4D:
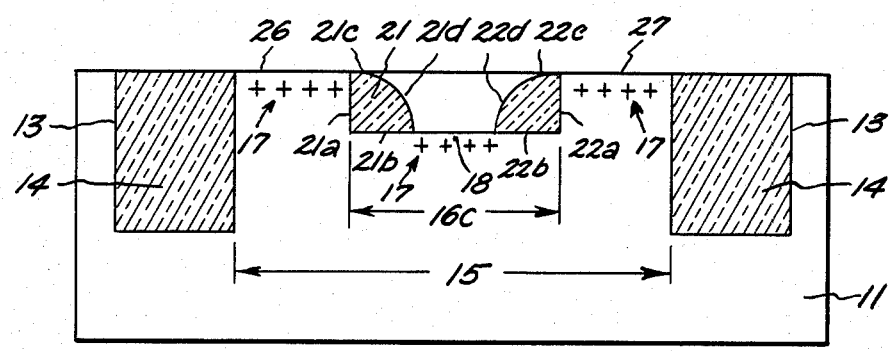

In the next step of the process shown in FIG. 4C, the wafer or substrate 11 is covered with a layer 20 of chemically vapor deposited silicon dioxide 0.5 micron thick. Thereafter, the layer 20 of silicon dioxide is anisotropically etched in trifluoromethane ($CHF_3$) to remove the silicon dioxide from the wafer until only spacer portions 21 and 22 remain, as shown in FIG. 4D. The height of the spacers 21 and 22 is 0.5 micron. The width of the bottom portions of the spacers 21 and 22 is also about 0.5 micron. The top portions of the spacer 21 and 22 are an extension of the plane of the major surface 12 of the substrate for a distance of about 0.2 micron. At this point in the process the exposed surface of the wafer are implanted with boron ions 17 with a concentration of about $2 \times 10^{11}$ ions per $cm^2$ at 20 kilovolts to provide threshold voltage control in the channel region 18 of the substrate between the spacers 21 and 22.

Figure 4E:
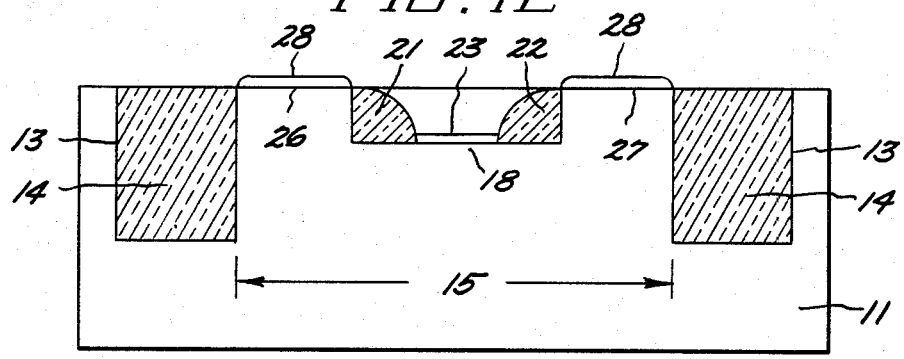

In the next step of the process shown in FIG. 4E, a layer 23 of silicon dioxide, referred to as gate oxide, is thermally grown over the channel region 18 and concurrently therewith layers 28 of silicon dioxide are grown over exposed surfaces 26 and 27 of the substrate 11.

Figure 4F:
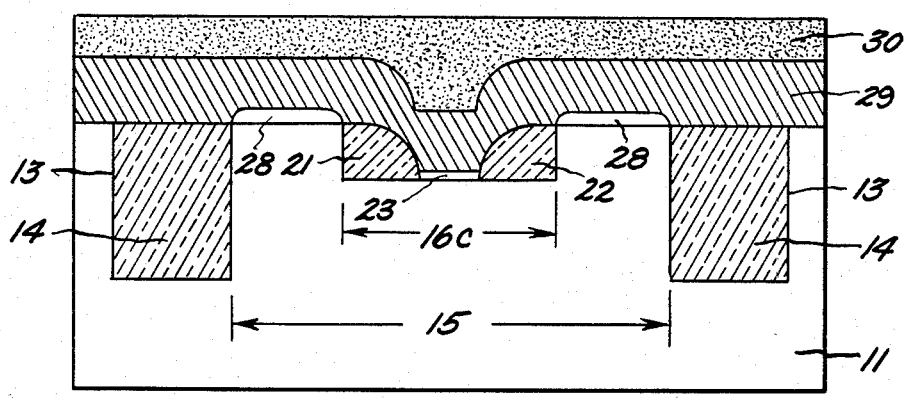

In the next step of the process, shown in FIG. 4F, a layer 29 of molybdenum 0.5 micron thick is sputtered over the exposed surface of the wafer 11 covering the gate oxide 23, oxide regions 28 overlying the silicon substrate and also over the oxide spacers 21 and 22. The wafer is next covered with a layer 30 of Hunt type 704 photoresist mentioned above to form a planar surface overlying the layer 29. Thereafter, the resultant wafer structure is planarized by anisotropic etching in a gaseous mixture of 67% oxygen and 33% carbon tetrachloride which etches the photoresist at the same rate it etches molybdenum. The planarizing process is continued until oxide layers are reached and sensed by the appearance of a carbon monoxide radiation line in the detection apparatus. The etching process is carried slightly beyond this point to etch an additional 0.1 micron of molybdenum to assure that top portions of the spacer members 21 and 22 are exposed, with the resultant gate electrode 24 of molybdenum slightly recessed, as shown in FIG. 4G. At this point in the process, the surface regions 26 and 27 of the substrate are lightly doped with about $10^{13}$ ions of boron per $cm^2$ and then driven into the substrate at a temperature of about 900° C. and for a time of 2 hours sufficient to produce diffusion thereof into the substrate to the extent of about 0.8 micron to form PN junctions 32 and 34. Junction 32 terminates short of point 33 and junctions 35 terminates short of point 36 as shown in FIG. 4H.

The next step of the process is illustrated in FIG. 4I. The surface of the wafer is covered with a layer 40 of silicon dioxide deposited thereon by chemical vapor deposition to a thickness of about 0.5 micron. Thereafter, the layer 40 of silicon dioxide is patterned using photolithographic masking and etching techniques to provide openings 41 and 42 therein to the surface portions 26 and 27 of the substrate and opening 43 (shown in FIG. 3) to gate electrode 24. Boron ions 49 are next implanted in surfaces 26 and 27 with a concentration of about $10^{15}$ boron ions per cm$^2$ at 40 kilovolts. The wafer is annealed at 900° C. and for a time of ¾ hour to cause activation and diffusion of boron ions for a distance of about 0.2 micron into the wafer. During this process the previously deposited or implanted boron ions now diffuse an additional distance in the substrate so that junction 32 now extends to point 33 and junction 35 extends to point 36. Region 31 is constituted of a heavily doped region adjacent the surface 26 and progressively lighter doped region extending to the point 33. Similarly, the region 34 has a heavily doped region adjacent the surface 27 and a progressively lighter doping extending to the point 36.

At this point in the process, metal contacts (not shown) are provided to the source region 31, the drain region 34 and gate electrode 24 of the transistor formed in the active region 15.

While in the embodiment of FIGS. 1-3, the sides 16a and 16b of the recess 16 are shown as orthogonal or perpendicular to the planar surface 12, the sides 16 and 16b could be disposed at other angles with respect to the planar surface 12, if desired.

While in the embodiment of the FIGS. 1-3, the top bases 21c and 22c of the insulating spacers 21 and 22 are shorter than the bottom bases 21b and 22b thereof, they could be made equal or greater than the bottom bases 21b and 22b, if desired.

While in the transistor depicted in FIGS. 4A-4I the specific dimensions are selected for the length 16c and the depth 16a of the recess 16 and for the lengths 21b and 22b of the insulating spacers 21 and 22, other dimensions greater or smaller than these dimensions could have been selected, as desired, to provide smaller or larger gate lengths.

While in the embodiment of FIGS. 1-3, the recess and the metallization incorporated therein is shown terminated in the oxide isolation regions 14, in an integrated circuit the recess and metallization therein would extend along or through the isolation regions and into other active regions 15 in which other transistors and circuit components are situated to provide appropriate interconnection therewith.

While molybdenum was utilized as the conductive material for the gate electrode 24, other conductive materials such as tungsten and doped polycrystalline silicon could be utilized.

A field effect transistor has been provided in which the gate or channel length is equal to the length 16c of the recess 16 which is a large dimension less the length of the bottom bases 21b and 22b of the spacers 21 and 22 which also can be of large dimensions. The length 16c is provided by a feature of large dimension in a mask. The lengths 21b and 22b are dependent on the depth of the recess 16 and the thickness of the layer 20 of oxide deposited in the recess, both of which are controllable process parameters. Thus, only a single mask having large feature size is utilized in fabricating the transistor of short gate length. The other masking steps utilized are the steps for forming openings 41, 42 and 43 in the oxide layer 40 and the step for patterning the metal layer utilized for contacting the source, drain and gate of the transistor. The photolithographic masks utilized in these steps would be gross masks, the alignment of which with respect to the mask for providing the recess is not critical.

A field effect transistor has been provided in which the electrodes all have surfaces lying substantially in the same plane, thereby facilitating the process of making conductive connections thereto.

A field effect transistor of short channel gate length and graded drain region has been provided which can withstand high drain-to-source voltages without breakdown.

A field effect transistor of small dimensions has been provided in which the source and drain regions extend deep into the substrate thereby enabling conductive connections to be made thereto without shorting of the PN junctions by contacts made to these regions.

A field effect transistor of small dimensions has been provided in which the gate-to-drain capacitance is independently controllable by a process parameter which controls the length of the base 22b and the length of the side 22a of the insulating spacer 22. Making the dimension 22a large increases gate-to-drain capacitance. Making the dimension 22b large decreases the gate-to-drain capacitance.

Figure 5:
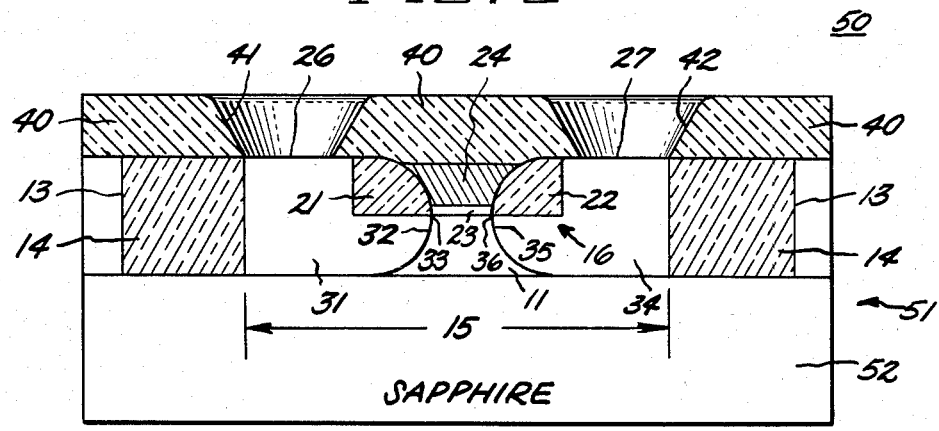
FIG. 5 is a sectional view of another embodiment of the present invention.

Reference is now made to FIG. 5 which shows a sectional view of a field effect transistor 50 formed on a silicon-on-sapphire substrate 51 consisting of a sapphire wafer 52 on which has been formed a layer 11 of silicon. Elements of FIG. 5 identical to elements of FIG. 4I are identically designated. The silicon-sapphire substrate is processed in a manner identical to the manner in which the silicon substrate 11 of FIGS. 1-3 is processed with certain exceptions. The isolating walls 14 of silicon dioxide would extend to the sapphire layer 52. Also, the PN junctions 32 and 34 would terminate in the sapphire layer 52. A principal advantage of such a structure is that source and drain capacitances are reduced over the source and drain capacitance of the structure of FIGS. 1-3.

While in the embodiments of the invention described above P-channel transistors were formed on N-type silicon substrates, N-channel transistors could as well be formed on P-type transistors in a similar manner.

While the invention has been described in specific embodiments, it will be understood that modifications may be made by those skilled in the art and it is intended by the appended claims to cover all such modifications and changes as fall within the true spirit and scope of the invention.

What is claimed is:

1. A field effect transistor comprising:
   a substrate of semiconductor material of one conductivity type having a planar surface,
   a recess in said planar surface of said substrate, said recess having first and second sides and a base therebetween,
   a first insulating spacer including a first side, a second side, a bottom base and a top base,
   the first side of said first spacer having a height equal to the height of the first side of said recess and contiguous therewith,
   the bottom base of said first spacer having a length less than one-half of the length of the base of said recess and contiguous therewith,
   the top base of said first spacer being substantially coplanar with said planar surface,
   a second insulating spacer including a first side, a second side, a bottom base, and a top base, the first side of said second spacer having a height equal to the height of the second side of said recess and contiguous therewith, the bottom base of said second spacer having a length less than one-half the length of the base of said recess and contiguous therewith, the top base of said second spacer being substantially coplanar with said planar surface, a thin insulating member having a bottom surface contiguous with the base of said recess between said first and second insulating spacers, a pair of sides, each contiguous with a respective one of said second sides of said first and second insulating spacers, a conductive member having a bottom base contiguous with the top surface of said thin insulating member, a top base extending between the second sides of said first and second insulating spacers, a first side contiguous with the second side of said first insulating spacer and a second side contiguous with the second side of said second insulating spacer, a first region of opposite conductivity type in said substrate adjacent said planar surface and said first insulating spacer, said first region forming a first PN junction with said substrate, said first PN junction having an edge in the base of said recess and adjacent the bottom surface of said thin insulating member and the bottom base of said first insulating spacer, a second region of opposite conductivity type in said substrate adjacent said planar surface and said second insulating spacer, said second region forming a second PN junction with said substrate, said second PN junction having an edge in the base of said recess and adjacent the bottom surface of said thin insulating member and the bottom base of said second insulating spacer.

2. The transistor of claim 1 in which the net impurity concentration of said substrate has a first value, in which the net impurity concentration in said first region of opposite conductivity type increases from zero at said first PN junction to a second value at said planar surface, in which the net impurity concentration in said substrate of one conductivity type increasing from zero at said first PN junction to substantially said first value at a distance along the base of said recess away from said first PN junction, and in which said second value of net impurity concentration is substantially greater than said first value of net impurity concentration.

3. The transistor of claim 2 in which the net impurity concentration in said first region is substantially linear graded from zero value at said first PN junction to said second value at said planar surface.

4. The transistor of claim 1 in which the first and second sides of said recess are substantially parallel and orthogonal to said planar surface.

5. The transistor of claim 4 in which the top base of said first insulating spacer has a length less than the length of the bottom base thereof and in which the top base of said second insulating spacer has a length less than the length of the bottom base thereof.

6. The transistor of claim 4 in which the height of the first side and the height of the second side of said recess are equal.

7. The transistor of claim 6 in which the height of said first side and the length of the bottom base of said first insulating spacer are substantially equal, and in which the height of said first side and the length of the bottom base of said second insulating spacer are substantially equal.

8. The transistor of claim 1 in which the bottom base of said first insulating spacer, the bottom base of said second insulating spacer, and the bottom surface of said thin insulating spacer are each of substantially the same length along the bottom base of said recess.

* * * * *